United States Patent
Zabroda

(10) Patent No.: US 8,482,449 B1
(45) Date of Patent: Jul. 9, 2013

(54) ANALOG-TO-DIGITAL CONVERTER WITH METASTABILITY DETECTOR

(75) Inventor: Oleksiy Zabroda, Constable, NY (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/561,236

(22) Filed: Jul. 30, 2012

(51) Int. Cl.
*H03M 1/12* (2006.01)

(52) U.S. Cl.
USPC ............................ 341/172; 341/118; 341/163

(58) Field of Classification Search
USPC .................................................. 341/163, 172
See application file for complete search history.

(56) References Cited

U.S. PATENT DOCUMENTS

| | | | |
|---|---|---|---|
| 4,093,878 A | 6/1978 | Paschal et al. | |
| 4,575,644 A | 3/1986 | Leslie | |
| 4,591,737 A | 5/1986 | Campbell | |
| 4,982,118 A | 1/1991 | Lloyd | |
| 5,017,814 A | 5/1991 | Lloyd | |
| 5,122,694 A | 6/1992 | Bradford et al. | |
| 5,391,935 A | 2/1995 | Gersbach et al. | |
| 6,157,338 A * | 12/2000 | Gross, Jr. | 341/161 |
| 6,384,619 B1 | 5/2002 | Kim et al. | |
| 6,603,415 B1 | 8/2003 | Somayajula | |
| 7,170,439 B1 * | 1/2007 | Chen | 341/172 |
| 7,501,974 B2 | 3/2009 | Confalonieri et al. | |

OTHER PUBLICATIONS

Branko L. Dokic, "CMOS and BiCMOS Regenerative Logic Circuits," Cutting Edge Research in New Technologies, Apr. 2012, pp. 29-58, InTech.
M. Furuta et al., "A 10-bit, 40-MS/s, 1.21 mW Pipelined SAR ADC Using Single-Ended 1.5-bit/cycle Conversion Technique," IEEE Journal of Solid-State Circuits, Jun. 2011, pp. 1360-1370, vol. 46, No. 6.
W. Liu et al., "A 12b 22.5/45MS/s 3.0mW 0.059mm^2 CMOS SAR ADC Achieving Over 90dB SFDR," IEEE International Solid-State Circuits Conference (ISSCC), Digest of Technical Papers, Feb. 2010, pp. 380-381.
T. Tulabandhula et al., "A 20MS/s 5.6 mW 6b Asynchronous ADC in 0.6 μm CMOS," IEEE 22nd International Conference on Very Large Scale Integration Design, Jan. 2009, pp. 111-116, New Delhi, India.
Kjetil. Kvalø, "Design of an Analog to Digital Converter with Superior Accuracy/Bandwidth vs. Power Ratio," Thesis Submission, Norwegian University of Science and Technology, Department of Electronics and Telecommunications, Sep. 2011, 110 pages.
S. Hoyos, "CMOS Comparators," Fall 2008, 57 pages.
"CMOS Comparators," Kyungpook National University, Integrated Systems Lab, Analog Integrated Circuit Design, 11 pages, accessed May 2012.

* cited by examiner

*Primary Examiner* — Khai M Nguyen
(74) *Attorney, Agent, or Firm* — Ryan, Mason & Lewis, LLP

(57) ABSTRACT

An analog-to-digital converter comprises a switched capacitor array configured to receive an analog input signal, a comparator having inputs coupled to respective outputs of the switched capacitor array, register circuitry having inputs coupled to respective outputs of the comparator, and a metastability detector associated with the register circuitry. The register circuitry is configured to generate control signals for application to respective control inputs of the switched capacitor array and to provide a digital output signal corresponding to the analog input signal. The metastability detector is configured to detect a metastability condition relating to signals at the respective outputs of the comparator. The register circuitry responsive to detection of the metastability condition forces bits of the digital output signal to particular logic levels. The register circuitry may comprise, for example, a successive approximation register, and the metastability detector may be at least partially incorporated within the successive approximation register.

20 Claims, 6 Drawing Sheets

ANALOG-TO-DIGITAL CONVERTER WITH METASTABILITY DETECTOR

BACKGROUND

An analog-to-digital converter (ADC) converts an applied analog input signal into a digital output signal. ADCs find application in a wide variety of communication, storage and signal processing applications. Examples of different types of ADCs known to those skilled in the art include successive approximation register (SAR) ADCs, as well as other types of ADCs in which conversion is performed in multiple stages, such as pipelined ADCs and sub-ranging ADCs.

These and other conventional ADCs typically incorporate one or more comparators. In a given such comparator, if the signals to be compared are sufficiently close to one another, a corresponding comparator latch may enter a metastable condition in which it produces invalid outputs. This type of metastability condition arising in a comparator latch can be a primary cause of glitches or other undesirable disturbances at the ADC output.

In conventional analog-to-digital converters, it is difficult to reduce these and other metastability-related output disturbances to a point where very low bit error rate (BER) is achievable. For example, conventional arrangements often have difficulty achieving BER on the order of $10^{-17}$, which can be required for implementation of certain Serializer-Deserializer (SerDes) links in communication applications.

SUMMARY

Illustrative embodiments of the invention provide ADCs that incorporate improved metastability detection functionality relative to conventional ADCs, thereby allowing significantly lower BER to be achieved than would otherwise be possible.

In one embodiment, an ADC comprises a switched capacitor array configured to receive an analog input signal, a comparator having inputs coupled to respective outputs of the switched capacitor array, register circuitry having inputs coupled to respective outputs of the comparator, and a metastability detector associated with the register circuitry. The register circuitry is configured to generate control signals for application to respective control inputs of the switched capacitor array and to provide a digital output signal corresponding to the analog input signal. The metastability detector is configured to detect a metastability condition relating to signals at the respective outputs of the comparator. The register circuitry responsive to detection of the metastability condition forces bits of the digital output signal to particular logic levels. The register circuitry may comprise, for example, an SAR, and the metastability detector may be at least partially incorporated within the SAR.

By way of example, the metastability condition may comprise a condition in which the signals at the respective comparator outputs have the same logic level instead of expected complementary logic levels. In such an arrangement, the register circuitry responsive to detection of the metastability condition may be configured to force a given bit of the digital output signal associated with the detected metastability condition to a first logic level (either "high" or "low") and to force lower-order bits of the digital output signal to a second logic level complementary to the first logic level.

One or more of the illustrative embodiments can provide an ADC that exhibits significantly improved performance in the presence of metastability conditions. For example, glitches and other undesirable output disturbances are considerably reduced. Also, this improved performance is achieved in a manner that does not adversely impact power consumption, operating speed or resolution.

Embodiments of the invention can be implemented in SAR ADCs as well as other types of ADCs in which conversion is performed in multiple stages, including, for example, pipelined ADCs or sub-ranging ADCs.

An ADC in accordance with one or more embodiments of the invention may be implemented, for example, as a stand-alone device, such as a packaged integrated circuit, or as an embedded component of a SerDes device or other type of processing device.

DETAILED DESCRIPTION

Embodiments of the invention will be illustrated herein in conjunction with exemplary ADCs and associated metastability detectors. It should be understood, however, that embodiments of the invention are more generally applicable to any ADC which can benefit from improved handling of metastability conditions, and may be implemented using circuitry other than that specifically shown and described in conjunction with the various illustrative embodiments.

Figure 1:
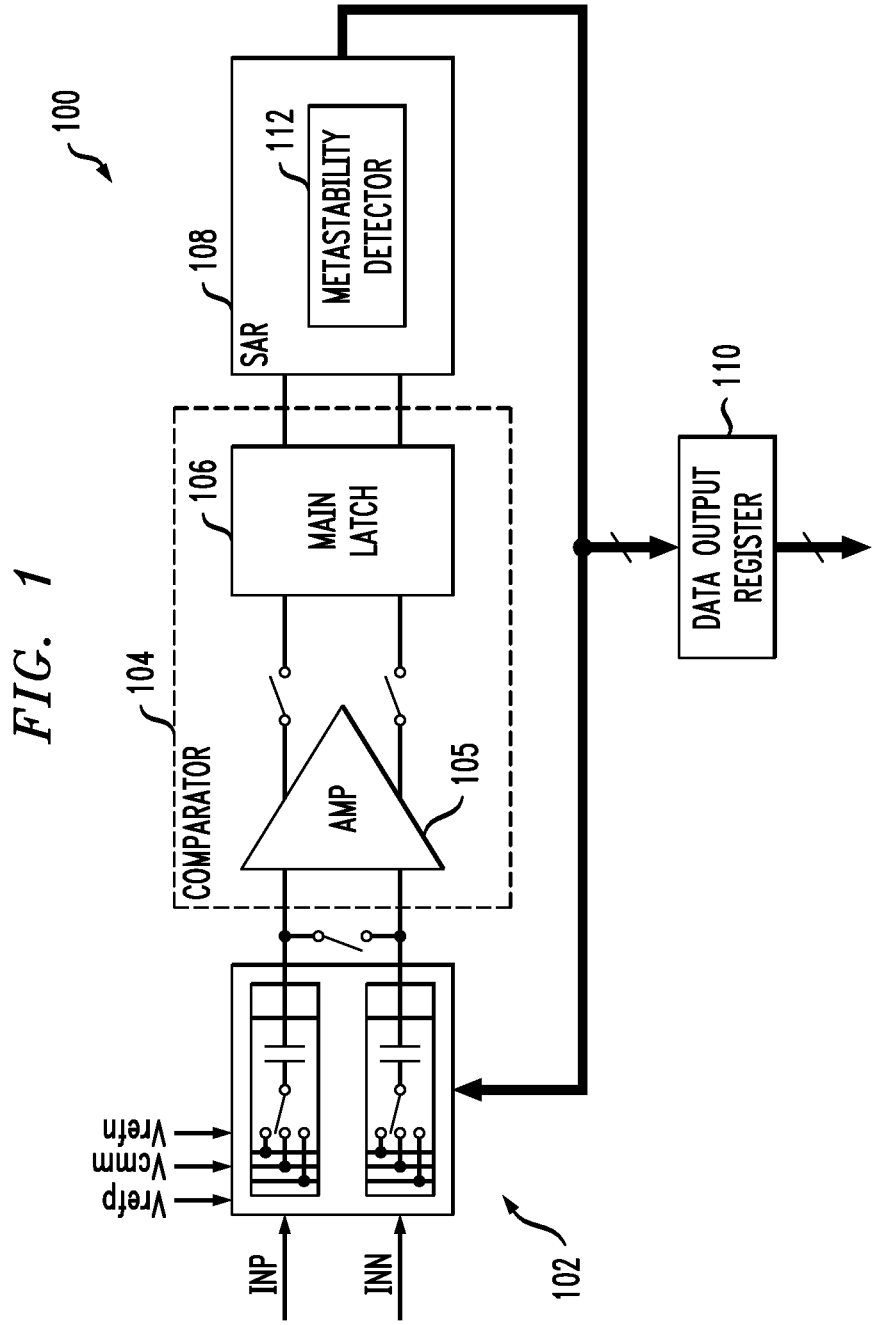
FIG. 1 is a block diagram of an ADC comprising a metastability detector in an illustrative embodiment of the invention.

FIG. 1 shows a block diagram of an ADC 100 in accordance with an illustrative embodiment of the invention. The ADC 100 comprises a switched capacitor array 102 configured to receive an analog input signal, and a comparator 104 having inputs coupled to respective outputs of the switched capacitor array 102.

The switched capacitor array 102 in the present embodiment is a differential switched capacitor array which receives a differential analog input signal via positive and negative differential inputs denoted INP and INN, respectively. The switched capacitor array in the present embodiment utilizes three voltage references, including a positive voltage reference Vrefp, a negative voltage reference Vrefn, and a common mode reference Vcmm. It is to be appreciated that other types of switched capacitor arrays can be used in other embodiments. The operation of the switched capacitor array 102 of the present embodiment will be described in greater detail below in conjunction with FIG. 2.

The comparator 104 comprises an amplifier 105 and a main comparator latch 106, also referred to herein as simply a main latch. Differential outputs of the amplifier 105 are switchably connectable to corresponding inputs of the main latch 106. A more detailed example of the main latch will be described below in conjunction with FIG. 3.

The ADC 100 further comprises an SAR 108. The SAR 108 may be viewed as an example of what is more generally referred to herein as "register circuitry" of the ADC 100. The SAR 108 in the present embodiment has differential inputs coupled to respective differential outputs of the comparator 104, and is configured to generate control signals for application to respective control inputs of the switched capacitor array 102. The SAR 108 also provides a digital output signal corresponding to the analog input signal converted to digital form. Although implemented using SAR 108 in the present embodiment, the ADC 100 in other embodiments may be implemented using other types of register circuitry, as will be appreciated by those skilled in the art.

Also included in the ADC 100 is a data output register 110. The data output register 110 may be configured, for example, to serve as an output buffer for the ADC 100. The data output register 110 may also be assumed to be part of "register circuitry" of the ADC 100, as that term is generally used herein.

The ADC 100 in the present embodiment may be more particularly described as an example of a differential charge redistribution switched capacitor SAR ADC using a triple reference voltage. Again, these particular features of the ADC 100 should not be viewed as being required in embodiments of the present invention.

The SAR 108 further comprises a metastability detector 112. The metastability detector 112 is configured to detect a metastability condition relating to signals at the respective outputs of the comparator 104. As will be described, the SAR 108 is configured so as to force bits of the digital output signal to particular logic levels responsive to detection of the metastability condition by the metastability detector 112. It should be noted that, although the metastability detector 112 is shown as being implemented entirely within the SAR 108 in the present embodiment, in other embodiments the metastability detector 112 may be implemented at least in part external to the SAR 108.

The metastability detector 112 may be configured to detect one or more different types of metastability conditions that may arise in the ADC 100. For example, in the present embodiment, the metastability detector 112 may be configured to detect a metastability condition in which differential outputs of the comparator 104 have the same logic level instead of expected complementary logic levels, which is indicative of the main latch 106 having entered a metastable condition in which it produces invalid outputs. Thus, the metastability condition in this example may result in both differential outputs of the comparator 104 simultaneously being at a logic high or a logic low level.

In response to such a detected metastability condition, the SAR 108 in the present embodiment is configured to force a most significant bit or other given bit of the digital output signal associated with the detected metastability condition to a first logic level (either "high" or "low"), and to force lower-order bits of the digital output signal to a second logic level complementary to the first logic level.

A more detailed example of the circuitry used to provide this functionality will be described below in conjunction with FIG. 4, although it should be understood that numerous other types of circuitry may be used in implementing embodiments of the invention. Also, other types of metastability conditions may be detected, as well as combinations of multiple different types of metastability conditions.

The ADC 100 as illustrated in FIG. 1 may include other elements in addition to or in place of those specifically shown, including one or more elements of a type commonly found in a conventional implementation of such a device. These and other conventional elements, being well understood by those skilled in the art, are not described in detail herein. It should also be understood that the particular arrangement of elements shown in FIG. 1 is presented by way of illustrative example only. Those skilled in the art will recognize that a wide variety of other device configurations may be used in implementing embodiments of the invention.

Figure 2:
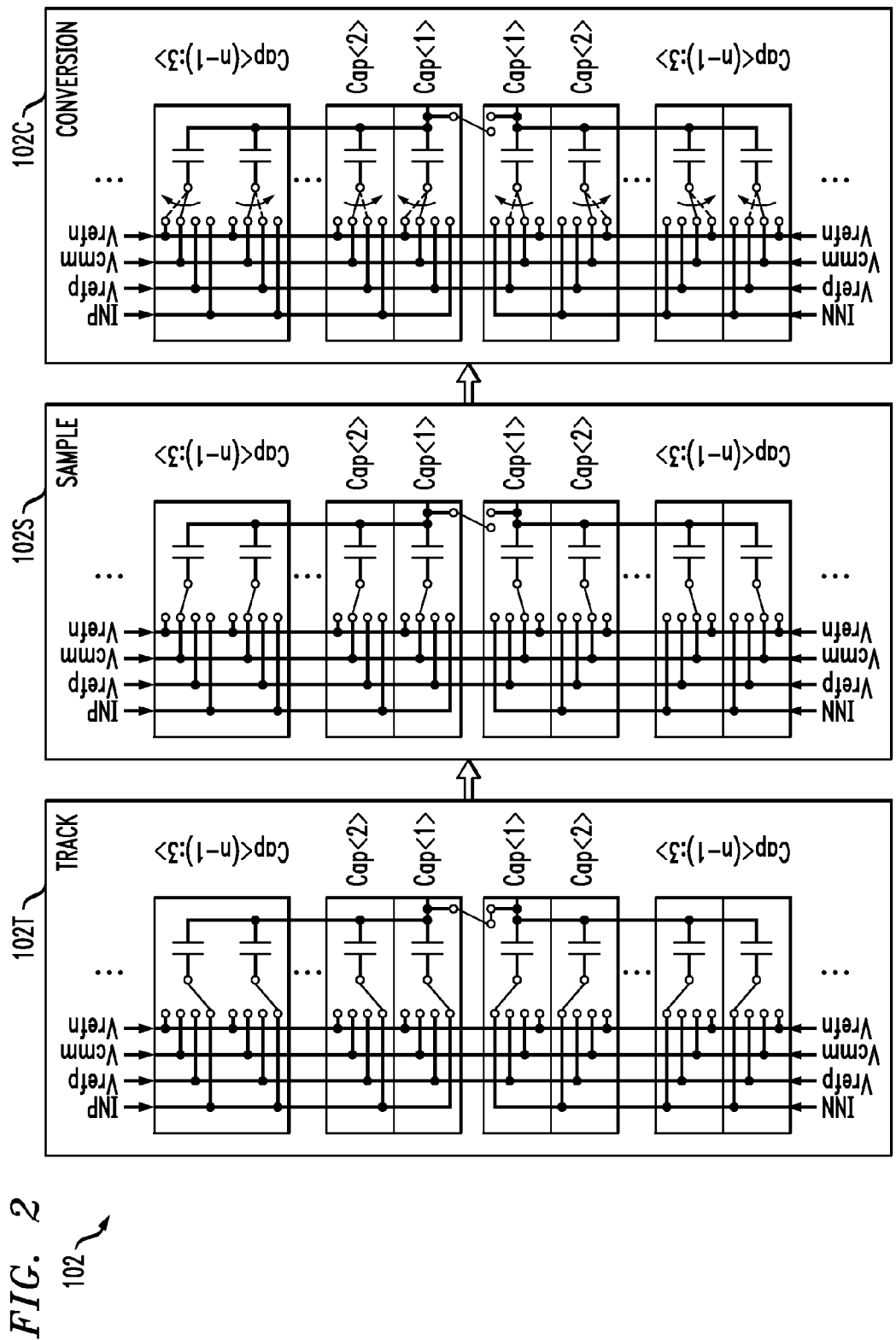
FIG. 2 illustrates track, sample and conversion modes of operation of a differential switched capacitor array of the FIG. 1 ADC in in an illustrative embodiment.

Referring now to FIG. 2, the switched capacitor array 102 of ADC 100 is shown in greater detail, with different instances of the array configuration for each of three distinct operating modes. As indicated previously, the switched capacitor array 102 in this embodiment is a differential switched capacitor array which utilizes three reference voltages Vrefp, Vcmm and Vrefn. The switched capacitor array more particularly comprises binary weighted capacitors and a plurality of switches, arranged as shown. The switches are illustratively formed using respective metal-oxide-semiconductor (MOS) devices. Each capacitor includes a top plate and a bottom plate.

The capacitors of the upper portion of the switched capacitor array associated with the positive input are binary weighted from a most significant bit (MSB) position to a least significant bit (LSB) position. The values of the capacitors of the lower portion associated with the negative input are substantially equal to the respective values of the corresponding capacitors of the upper portion of the switched capacitor array, and hence the lower portion capacitors are similarly binary weighted. Thus, each of the capacitors in the upper or lower portion of the switched capacitor array corresponds to a particular bit position of the digital output signal generated by the ADC 100. Utilizing an additional reference voltage as in the present embodiment substantially increases the ADC conversion speed and also allows the switched capacitor array dimension to be reduced by one relative to a double reference voltage arrangement. Thus, the number of capacitors in each portion of the array is one less than the number of bits in the digital output signal.

The upper portion of the switched capacitor array includes switches that controllably connect bottom plates of respective capacitors to a selected one of INP, Vrefp, Vcmm and Vrefn responsive to applied control signals. Similarly, the lower portion of the array includes switches that controllably connect bottom plates of respective capacitors to a selected one of INN, Vrefp, Vcmm and Vrefn responsive to applied control signals. The top plates of the capacitors in each of the upper and lower portions of the array are connected together as shown in the figure, and are connectable to the top plates of the capacitors in the other portion via an additional switch controlled by an additional control signal. More particularly, the top plates of the capacitors in the upper portion of the switched capacitor array are coupled to the positive differential input of the comparator 104, and the top plates of the capacitors in the lower portion of the switched capacitor array are coupled to the negative differential input of the comparator 104.

The switched capacitor array 102 is configurable into its different modes of operation using the above-noted control signals. These include a track mode, a sample mode and a conversion mode, corresponding to the respective configurations 102T, 102S and 102C shown in FIG. 2. The conversion mode involves performing a digital-to-analog conversion (DAC) function as part of the overall analog-to-digital conversion performed by the ADC 100.

The differential outputs of the switched capacitor array 102 are coupled to differential inputs of the comparator 104, and the differential outputs of the comparator 104 are coupled to differential inputs of the SAR 108. As will be illustrated in FIG. 4, the SAR 108 comprises a plurality of sets of data latches, also referred to herein as D-latches. The outputs of the SAR 108 are coupled to control inputs of the switched capacitor array 102 and to inputs of the data output register 110.

In the track mode of operation, corresponding to configuration 102T in the figure, the bottom plates of the capacitors are connected to input signals INP or INN as indicated, and the switch connecting the top plates of the upper and lower portions is closed. During this mode, the capacitors of the upper and lower portions are precharged to the respective INP or INN input voltage.

In the sample mode of operation, corresponding to configuration 102S in the figure, the switch connecting the top plates of the upper and lower portions is opened, and then the bottom plates of all of the capacitors are connected to Vcmm.

In the conversion mode of operation, corresponding to configuration 102C in the figure, the switch connecting the top plates of the upper and lower portions remains opened, and the comparator 104 evaluates the output of the switched capacitor array. The comparator output is latched in main latch 106 and provided to the corresponding D-latches of the SAR 108. Depending on the latched comparator output, the capacitor corresponding to the bit being converted of one of the upper and lower portions of the switched capacitor array is reconnected from Vcmm to Vrefn while the corresponding capacitor of the other portion of the switched capacitor array is reconnected from Vcmm to Vrefp. During this charge redistribution, the common mode voltage of the top plates of the capacitors is not changing but the differential voltage is changing. After settling of the redistributed charge, the comparator 104 is ready to evaluate the next bit. This procedure starts with the MSB, and is repeated in descending bit order until all of the bit positions are evaluated.

As indicated previously, the comparator 104 can be susceptible to metastability conditions. For example, in the FIG. 2 arrangements, metastability in the main latch 106 could force the capacitors in both upper and lower portions of the switched capacitor array to be reconnected in the same direction or to not be connected to any of the reference voltages at all, leading to corruption in the conversion.

These and other metastability issues are addressed in the present embodiment by appropriate configuration of main latch 106 in comparator 104 and metastability detector 112 in SAR 108, as will now be described in conjunction with FIGS. 3, 4 and 5.

Figure 3:
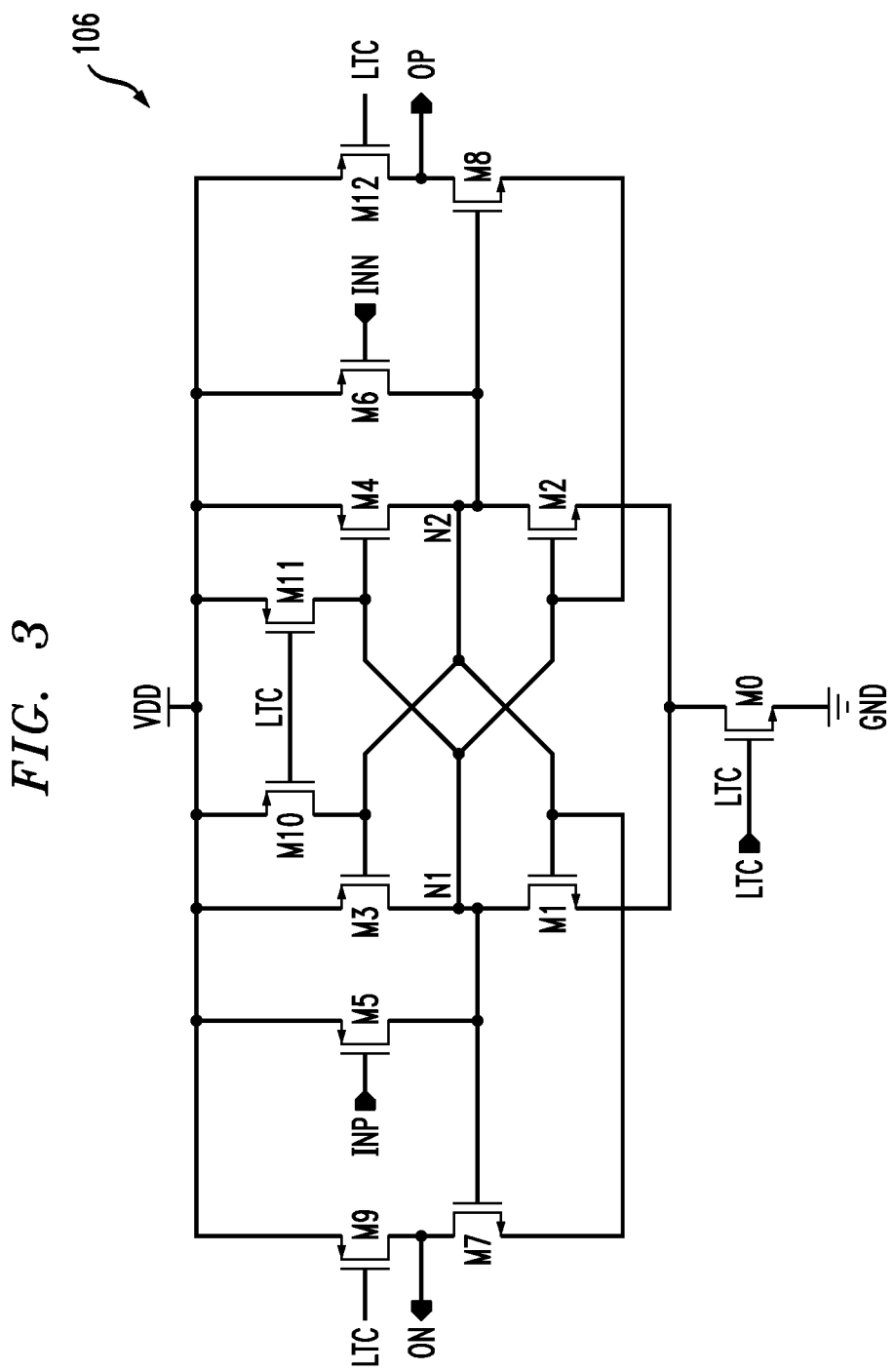
FIG. 3 is a schematic diagram of a main latch implemented in a comparator of the FIG. 1 ADC.

Referring initially to FIG. 3, an exemplary configuration of the main latch 106 is shown. The main latch 106 in this embodiment is configured so as to generate differential outputs for application to corresponding inputs of SAR 108. The main latch 106 comprises N-type MOS (NMOS) transistors M0, M1, M2, M7 and M8, and P-type MOS (PMOS) transistors M3, M4, M5, M6, M9, M10, M11 and M12 arranged as shown. Transistor M0 enables operation of a latch element formed by a pair of cross-coupled inverters, with a first one of the inverters corresponding to transistors M1 and M3 and a second one of the inverters corresponding to transistors M2 and M4. Transistors M5 and M6 are input transistors that receive the respective input signals INP and INN from the comparator amplifier 105. Transistors M7 and M8 are output transistors that provide respective output signals ON and OP. Transistors M9 through M12 are reset transistors controlled by a control signal denoted LTC that also controls the latch enable transistor M0.

When LTC is at a logic low level, NMOS transistor M0 is in its off state and PMOS transistors M9-M12 are in their on states. Transistors M1, M2, M3 and M4 are also in their off states. The internal nodes N1 and N2 of the latch element are therefore reset to the supply voltage VDD. The gates of the input PMOS transistors M5 and M6 are precharged to the respective output signal voltages of the comparator amplifier 105.

After LTC transitions from the logic low level to the logic high level, transistor M0 is turned on, and the nodes N1 and N2 evaluate to particular complementary logic levels in accordance with the input signals INP and INN. A given one of the output transistors M7 and M8 can turn on and produce a logic low output only when the latch 106 is not in a metastable condition, and otherwise the outputs of the latch 106 will each remain at a logic high level. Thus, under the metastability condition in the present embodiment, the latch outputs are both at the same logic level, and in this case more particularly at a logic high level, rather than at complementary logic levels.

Figure 4:
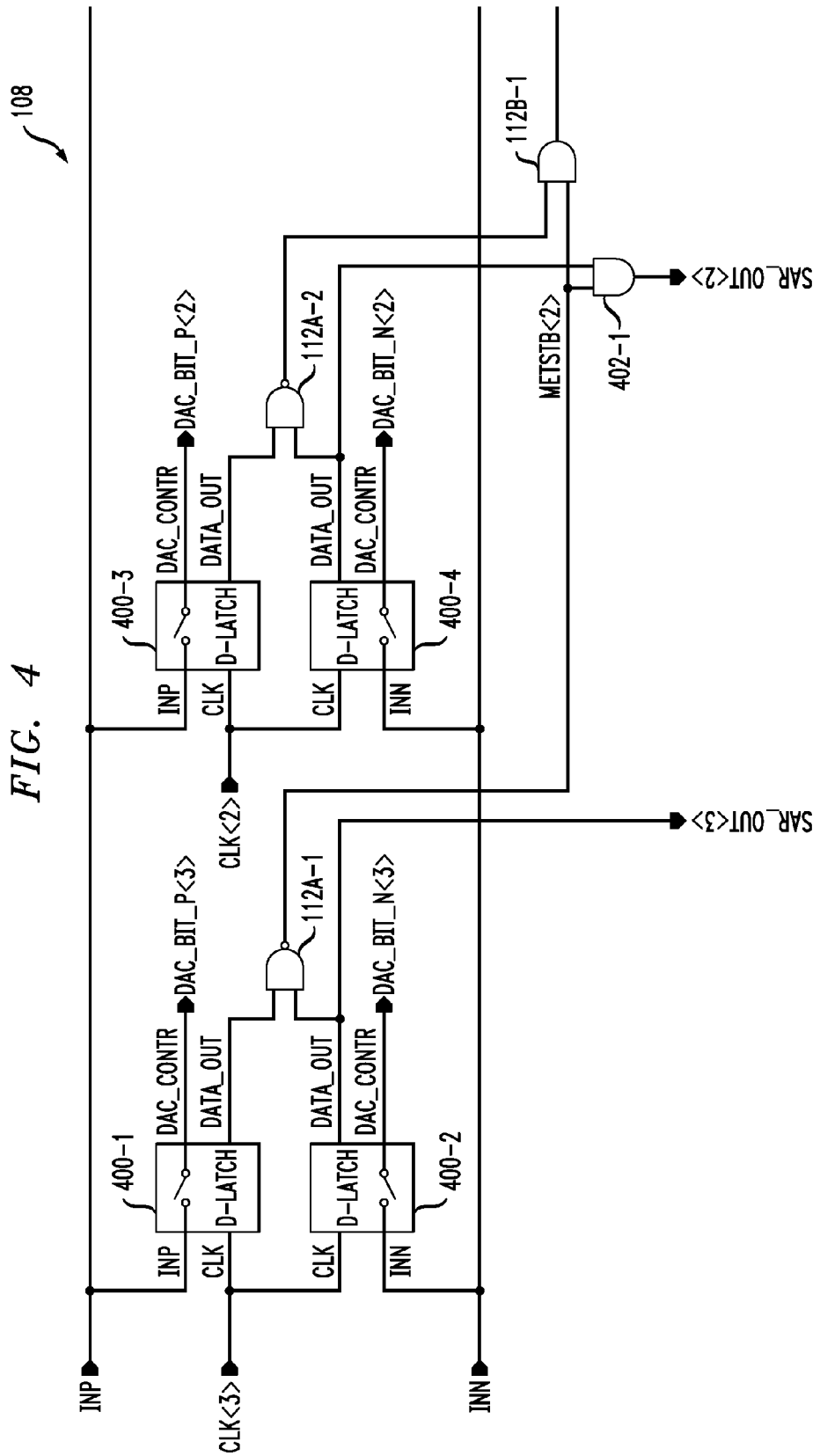
FIG. 4 shows a SAR of the FIG. 1 ADC and its associated metastability detector.
Figure 4:
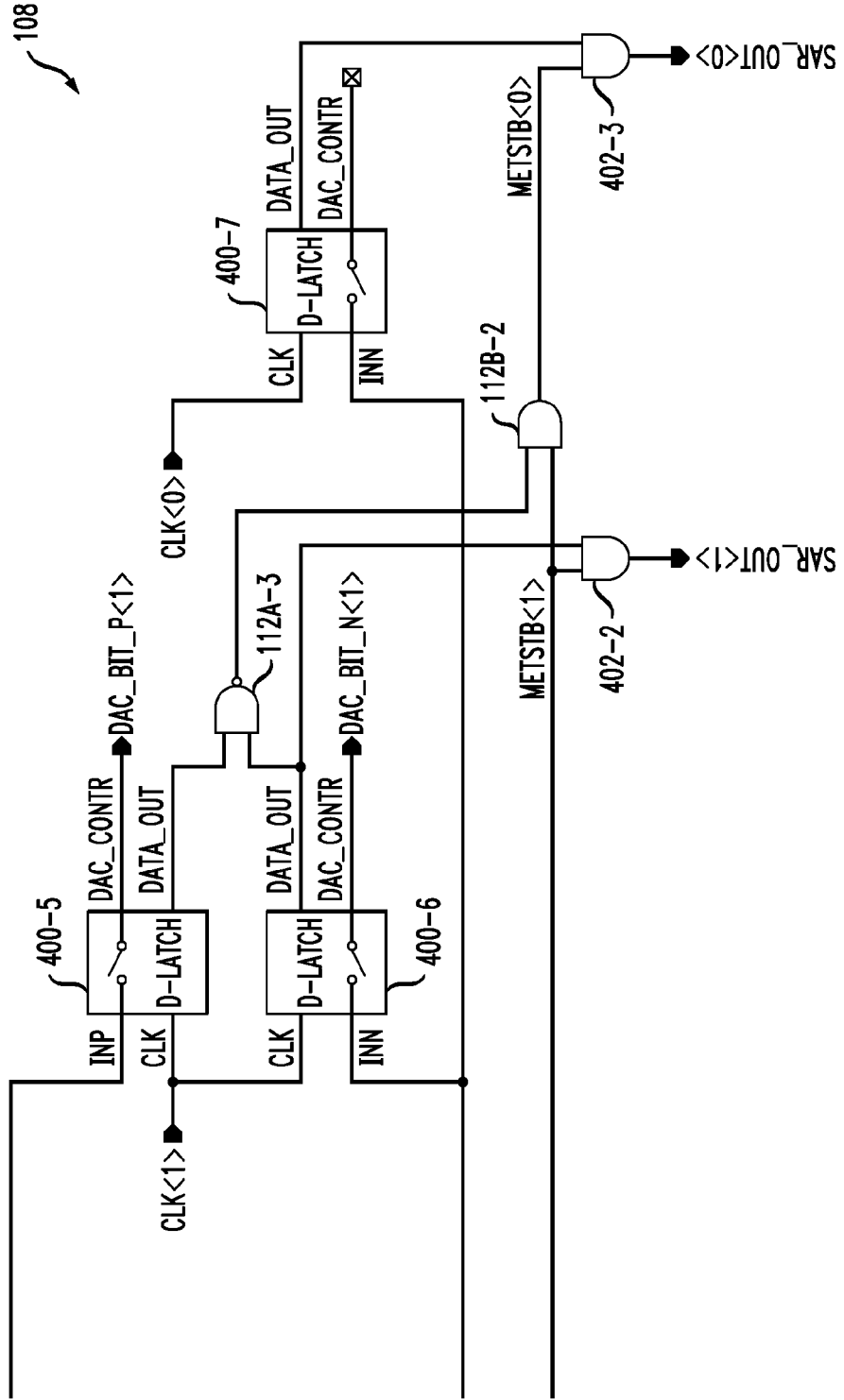

FIG. 4 shows the SAR 108 which incorporates the metastability detector 112. The INP and INN inputs of the SAR 108 are coupled to the OP and ON outputs of the main latch 106 of the comparator 104. The SAR 108 includes multiple pairs of D-latches, including a first pair of D-latches 400-1 and 400-2, a second pair of D-latches 400-3 and 400-4, and a third pair of D-latches 400-5 and 400-6. One of the D-latches of each pair has a data input coupled to the positive output of the comparator 106 and the other D-latch of each pair has a data input coupled to the negative output of the comparator 106. The SAR 108 further includes an additional D-latch 400-7, which has its data input coupled to the positive output of the comparator 106. The D-latches 400-1 and 400-2 of the first pair correspond to the MSB of the digital output signal, and the D-latch 400-7 corresponds to the LSB of the digital output signal.

Each of the D-latches of a given one of the pairs is clocked by a clock signal that is common to that pair. Thus, D-latches 400-1 and 400-2 are clocked by a clock signal denoted CLK<3>, D-latches 400-3 and 400-4 are clocked by a clock signal denoted CLK<2>, and D-latches 400-5 and 400-6 are clocked by a clock signal denoted CLK<1>. The additional D-latch 400-7 is clocked by a clock signal denoted CLK<0>. The upper D-latches 400-1, 400-3 and 400-5 produce respective DAC conversion control signals DAC_BIT_P<3>, DAC_BITP<2> and DAC_BIT_P<1>, respectively. These DAC control signals are supplied back to the switched capacitor array 102 for use in the conversion mode previously described. The additional D-latch 400-7 does not produce a DAC control signal since in the present embodiment there is no need for such a control signal for the LSB position.

The SAR 108 also produces the digital output signal having bits denoted as SAR_OUT<3>, SAR_OUT<2>, SAR_OUT<1> and SAR_OUT<0>, where SAR_OUT<3> denotes the MSB and the remaining bits are lower-order bits, with SAR_OUT<0> being the LSB. Each of the bits of the digital output signal is determined based at least in part on outputs of respective designated D-latches in the pairs of D-latches. The bit SAR_OUT<3> is provided as a data output of the lower D-latch 400-2 of the first pair of D-latches. The remaining bits SAR_OUT<2>, SAR_OUT<1> and SAR_OUT<0> are generated as a function of designated D-latch data outputs as well as corresponding metastability detection signals METSTB<2>, METSTB<1> and METSTB<0> provided by the metastability detector 112.

The metastability detector 112 in this embodiment comprises a plurality of logic gates 112A-1, 112A-2 and 112A-3 associated with respective ones of the pairs of D-latches 400, with a given one of the logic gates 112A having first and second inputs coupled to respective data outputs of the respective D-latches of the corresponding pair of D-latches. Thus, logic gate 112A-1 receives as its inputs the data outputs of D-latches 400-1 and 400-2, logic gate 112A-2 receives as its inputs the data outputs of D-latches 400-3 and 400-4, and logic gate 112A-3 receives as its inputs the data outputs of D-latches 400-5 and 400-6. The logic gates 112A are illustratively implemented as NAND gates.

The metastability detector 112 further comprises additional logic gates 112B-1 and 112B-2. The additional logic gate 112B-1 has first and second inputs coupled to respective outputs of the logic gates 112A-1 and 112A-2. The additional logic gate 112B-2 has first and second inputs coupled to respective outputs of the logic gates 112A-2 and 112A-3. The logic gates 112B are illustratively implemented as AND gates.

Although the logic gates 112A and 112B of the metastability detector 112 are illustratively implemented as NAND gates and AND gates, respectively, in this embodiment, other types and arrangements of logic gates or other logic circuitry may be used in other embodiments.

The SAR 108 further comprises output gates 402-1, 402-2 and 402-3 which provide the respective bits SAR_OUT<2>, SAR_OUT<1> and SAR_OUT<0> of the digital output signal. Output gate 402-1 generates bit SAR_OUT<2> as a function of the data output of D-latch 400-4 and the metastability signal METSTB<2>. Output gate 402-2 generates bit SAR_OUT<1> as a function of the data output of D-latch 400-6 and the metastability signal METSTB<1>. Output gate 402-3 generates bit SAR_OUT<0> as a function of the data output of D-latch 400-7 and the metastability signal METSTB<0>.

In an exemplary metastability condition, the outputs of the comparator 104 are both stuck at a logic high level, as previously described. Accordingly, the outputs of both D-latches 400 in each pair will also be at logic high levels. However, the outputs of the NAND gates 112A in this case will be at logic low levels, thereby each providing an active low metastability flag. These metastability signals are used to force all of the lower-order bits SAR_OUT<2>, SAR_OUT<1> and SAR_OUT<0> of the SAR 108 to logic low levels, via respective output gates 402-1, 402-2 and 402-3. The most significant bit SAR_OUT<3> in the present embodiment will remain at the logic high level.

The FIG. 4 SAR circuitry is therefore configured such that glitches and other output disturbances are avoided. The detected metastability conditions in these embodiments do not result in corruption of the ADC output. Moreover, these improvements are provided while also simplifying the SAR circuitry and reducing power consumption, relative to conventional arrangements.

Referring again to the ADC 100 as shown in FIG. 1, the data output register 110 may be configured to include additional latches for storing respective data output bits independent of the switched capacitor array control bits, the latter which should generally be switched off immediately after LSB evaluation. Use of such additional latches for the data output bits in data output register 110 allows additional time for data transfer to an ADC output bus. The additional data output latches can also be used to address metastability conditions that may arise in one or more of the D-latches 400 of the SAR 108, for example, in a situation in which the output of the main latch 106 of comparator 104 is unable to fully trip a given one of the D-latches 400. The trigger thresholds of these additional data output latches can be shifted with respect to the trigger thresholds of the D-latches 400 of the SAR 108 in order to address the metastability conditions arising in the D-latches.

Figure 5:
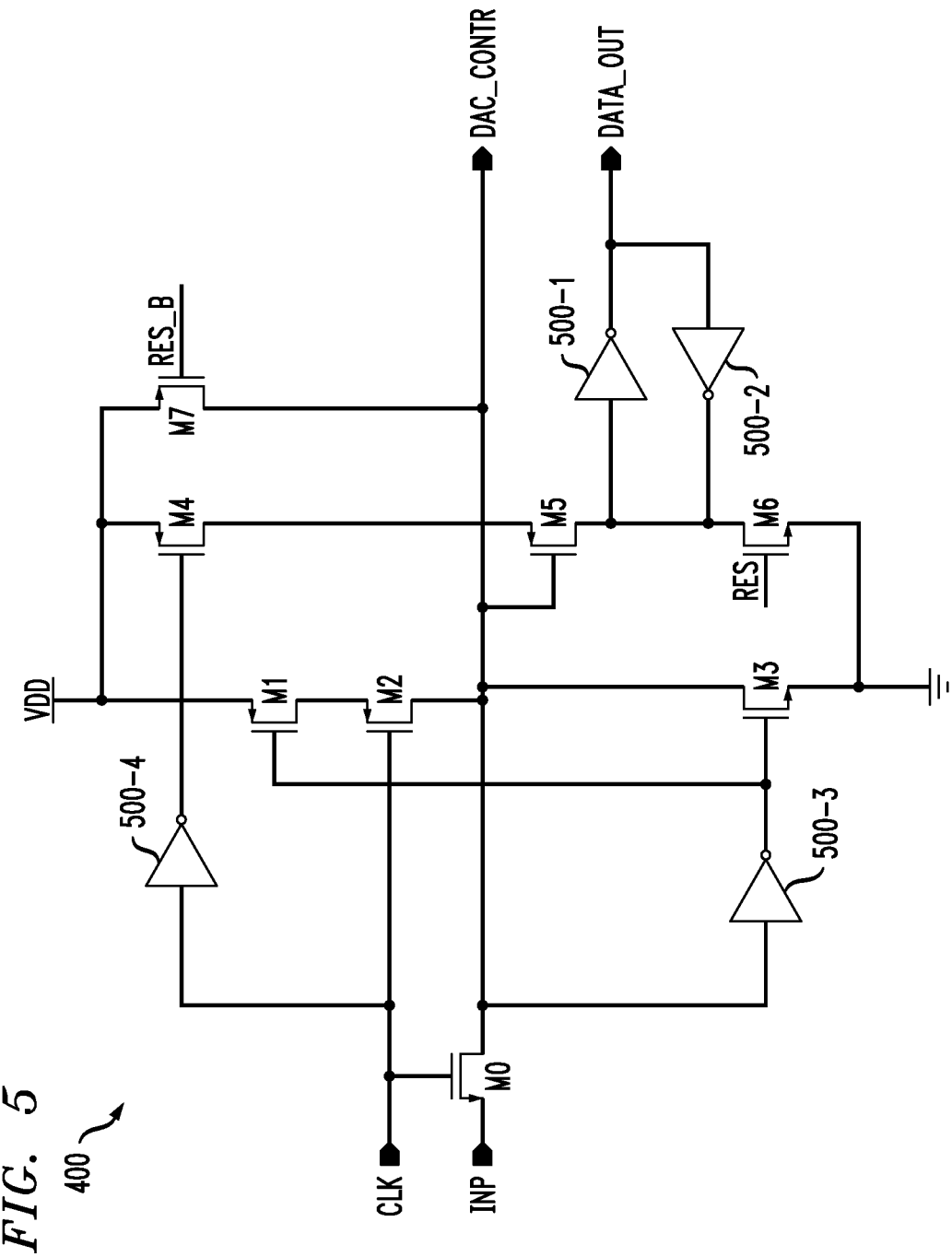
FIG. 5 is a schematic diagram of a data latch implemented in the SAR of FIG. 4.

FIG. 5 shows a schematic diagram of a given one of the D-latches 400. The D-latch 400 in this embodiment comprises inverters 500-1, 500-2, 500-3 and 500-4, NMOS transistors M0, M3 and M6, and PMOS transistors M1, M2, M4, M5 and M7. The inverters 500-1 and 500-2 are arranged to form a latch element. The data input is denoted INP in this embodiment, such that the D-latch 400 more particularly corresponds to one of the upper D-latches 400-1, 400-3 or 400-5, although it is assumed that the other D-latches 400-2, 400-4, 400-6 and 400-7 that have their data inputs coupled to INN are configured in a similar manner.

The output DAC control signal provided by the D-latch 400 is denoted DAC_CONTR. The gate of transistor M6 receives reset signal RES, which is active high, and M7 receives the reset signal RES_B, which is active low. The reset signals do not have to be complementary. It is beneficial to insert signal RES with some delay with respect to signal RES_B allowing more time for transfer of the output data. The output DATA_OUT of the D-latch 400 is provided by the output of inverter 500-1. The clock signal CLK is applied to the gates of M0 and M2, and in inverted form via inverter 500-4 to the gate of M4. The clock signal controls M0 which acts as a transmission gate to pass the input INP to the input of inverter 500-3, to the drains of M2 and M3 and to the gate of M5. When CLK goes low, the DAC_CONTR output is latched by transistors M1, M3 and the inverter 500-3.

The D-latch arrangement illustrated in FIG. 5 helps to improve conversion speed in the ADC 100 because a given main latch output is coupled to the corresponding control output of the D-latch 400 through the single NMOS transistor M0. The inverter 500-3 and transistor M3 provide positive feedback to speed up the transition of the DAC_CONTR output from a logic high level to a logic low level.

The data output DATA_OUT of the D-latch 400 is generated by a Schmitt trigger comprising PMOS transistor M5 and the two inverters 500-1 and 500-2. The Schmitt trigger may also be used as a portion of the data output register 110. The trip point of the Schmitt trigger is lower than a trip point associated with generation of the DAC_CONTR output. Thus, if the DAC_CONTR output is in a metastable condition, the DATA_OUT output remains at a logic high level. On the other hand, if the DATA_OUT output is in a metastable condition, the DAC_CONTR output is still valid and the ADC will generate a non-corrupted output regardless of whether or not the metastability flag is generated. The above-noted trip points may be viewed as examples of what are more generally referred to herein as "trigger thresholds" of the associated latches.

It is to be appreciated that the particular circuitry configurations illustrated in FIGS. 1 through 5 are presented by way of illustrative example only, and other embodiments may use other types and arrangements of circuitry.

For example, in one or more of these other embodiments, the conductivity types of at least a subset of the PMOS and NMOS transistors of the circuitry may be reversed, and other suitable modifications may be made to the circuitry, control signals and associated signaling levels, as would be appreciated by one skilled in the art.

Embodiments of the invention are particularly well suited for use in high-speed SerDes devices, as well as other types of processing devices that demand very low BER performance. Such processing devices may include, for example, computers, servers or portable communication devices such as mobile telephones.

A given ADC configured in accordance with an embodiment of the invention may be implemented as a stand-alone device, for example, as a packaged integrated circuit device suitable for incorporation into a higher-level circuit board or other system. Other types of implementations are possible, such as an embedded device, where the ADC may be, for example, embedded into a processor or other type of integrated circuit device which comprises additional circuitry coupled to the ADC. More particularly, an ADC as described herein may comprise, for example, an embedded device implemented within a microprocessor, digital signal processor (DSP), application-specific integrated circuit (ASIC), field-programmable gate array (FPGA) or other type of processor or integrated circuit device.

As indicated above, embodiments of the invention may be implemented in the form of integrated circuits. In fabricating such integrated circuits, identical die are typically formed in a repeated pattern on a surface of a semiconductor wafer. Each die includes an ADC as described herein, and may include other structures or circuits. The individual die are cut or diced from the wafer, then packaged as an integrated circuit. One skilled in the art would know how to dice wafers and package die to produce integrated circuits. Integrated circuits so manufactured are considered embodiments of this invention.

Again, it should be emphasized that the above-described embodiments of the invention are intended to be illustrative only. For example, other embodiments can use different types and arrangements of switched capacitor arrays, comparators, register circuitry, metastability detectors, logic gates or other logic circuitry, transistor conductivity types, control signals, and other elements for implementing the described functionality. These and numerous other alternative embodiments within the scope of the following claims will be apparent to those skilled in the art.

What is claimed is:

1. An analog-to-digital converter comprising:
   a switched capacitor array configured to receive an analog input signal;
   a comparator having inputs coupled to respective outputs of the switched capacitor array;
   register circuitry having inputs coupled to respective outputs of the comparator, the register circuitry being configured to generate control signals for application to respective control inputs of the switched capacitor array and to provide a digital output signal corresponding to the analog input signal; and
   a metastability detector associated with the register circuitry;
   wherein the metastability detector is configured to detect a metastability condition relating to signals at the respective outputs of the comparator; and
   wherein the register circuitry responsive to detection of the metastability condition forces bits of the digital output signal to particular logic levels.

2. The analog-to-digital converter of claim 1 wherein the register circuitry comprises a successive approximation register.

3. The analog-to-digital converter of claim 2 wherein the metastability detector is at least in part incorporated within the successive approximation register.

4. The analog-to-digital converter of claim 1 wherein the metastability condition comprises a condition in which the signals at the respective comparator outputs have the same logic level instead of expected complementary logic levels.

5. The analog-to-digital converter of claim 4 wherein the register circuitry responsive to detection of the metastability condition forces a given bit of the digital output signal associated with the detected metastability condition to a first logic level and forces lower-order bits of the digital output signal to a second logic level complementary to the first logic level.

6. The analog-to-digital converter of claim 2 wherein the successive approximation register comprises a plurality of pairs of data latches, with one of the data latches of each pair being coupled to a positive output of the comparator and the other data latch of each pair being coupled to a negative output of the comparator.

7. The analog-to-digital converter of claim 6 wherein the metastability detector comprises a plurality of first logic gates associated with respective ones of the pairs of data latches, a given one of the first logic gates having first and second inputs coupled to respective data outputs of the respective data latches of the corresponding pair of data latches.

8. The analog-to-digital converter of claim 7 wherein the metastability detector further comprises at least one second logic gate having first and second inputs coupled to respective outputs of respective ones of the first logic gates.

9. The analog-to-digital converter of claim 8 wherein the first logic gates comprise NAND gates and the second logic gates comprise AND gates.

10. The analog-to-digital converter of claim 7 wherein one or more of the bits of the digital output signal are determined based at least in part on outputs of respective designated data latches in the pairs of data latches.

11. The analog-to-digital converter of claim 10 wherein the successive approximation register further comprises, for each of at least a subset of the bits of the digital output signal, a corresponding output gate that provides the corresponding bit as a function of a data output of one of the data latches and a metastability signal from the metastability detector.

12. The analog-to-digital converter of claim 1 wherein the analog-to-digital converter comprises at least one of a pipelined analog-to-digital converter and a sub-ranging analog-to-digital converter.

13. The analog-to-digital converter of claim 2 further comprising a data output register comprising a plurality of data latches having trigger thresholds that are adjusted relative to trigger thresholds of data latches in the successive approximation register so as to address metastability conditions that may arise in the data latches of the successive approximation register.

14. An integrated circuit comprising the analog-to-digital converter of claim 1.

15. A processing device comprising the analog-to-digital converter of claim 1.

16. The processing device of claim 15 wherein the processing device comprises a serializer-deserializer that incorporates the analog-to-digital converter.

17. A method comprising:
    receiving an analog input signal;
    processing the analog input signal to provide a digital output signal corresponding to the analog input signal;
    detecting a metastability condition in the processing step; and
    responsive to the detected metastability condition, forcing bits of the digital output signal to particular logic levels.

18. The method of claim 17 wherein the detecting step comprises detecting a metastability condition in which signals at respective comparator outputs have the same logic level instead of expected complementary logic levels.

19. The method of claim 17 wherein the forcing step comprises forcing a most significant bit of the digital output signal to a first logic level that is complementary to its logic level under the metastability condition and forcing lower-order bits of the digital output signal to a second logic level complementary to the first logic level.

20. An apparatus comprising:
    a metastability detector configured for implementation in association with register circuitry of an analog-to-digital converter;

the analog-to-digital converter comprising a switched capacitor array configured to receive an analog input signal, and a comparator having inputs coupled to respective outputs of the switched capacitor array, the register circuitry having inputs coupled to respective outputs of the comparator, the register circuitry being configured to generate control signals for application to respective control inputs of the switched capacitor array and to provide a digital output signal corresponding to the analog input signal;

wherein the metastability detector is configured to detect a metastability condition relating to signals at the respective outputs of the comparator, so as to thereby permit the register circuitry responsive to detection of the metastability condition to force bits of the digital output signal to particular logic levels.

* * * * *